United States Patent
Imahori et al.

(10) Patent No.: US 9,622,393 B2
(45) Date of Patent: Apr. 11, 2017

(54) WIRING MEMBER

(71) Applicant: Hitachi Metals, Ltd., Tokyo (JP)

(72) Inventors: Masaaki Imahori, Hitachinaka (JP); Yoshikazu Hayakawa, Hitachi (JP); Takahiro Futatsumori, Mito (JP)

(73) Assignee: HITACHI METALS, LTD., Tokyo (JP)

( * ) Notice: Subject to any disclaimer, the term of this patent is extended or adjusted under 35 U.S.C. 154(b) by 0 days.

(21) Appl. No.: 14/674,663

(22) Filed: Mar. 31, 2015

(65) Prior Publication Data

US 2015/0289420 A1   Oct. 8, 2015

(30) Foreign Application Priority Data

Apr. 2, 2014  (JP) .................... 2014-076248

(51) Int. Cl.
| | |
|---|---|
| *H05K 9/00* | (2006.01) |
| *H01F 27/26* | (2006.01) |
| *H01F 17/06* | (2006.01) |
| *H01R 9/03* | (2006.01) |
| *H01R 13/52* | (2006.01) |
| *H01R 13/6592* | (2011.01) |

(52) U.S. Cl.
CPC ............ *H05K 9/0018* (2013.01); *H01F 17/06* (2013.01); *H01F 27/263* (2013.01); *H05K 9/0098* (2013.01); *H01F 2017/065* (2013.01); *H01R 9/032* (2013.01); *H01R 13/5202* (2013.01); *H01R 13/6592* (2013.01); *H01R 2201/26* (2013.01)

(58) Field of Classification Search
CPC .................. H01F 2017/065; H05K 9/0098
USPC ........................................... 439/76.2
See application file for complete search history.

(56) References Cited

U.S. PATENT DOCUMENTS

| | | | | |
|---|---|---|---|---|
| 5,414,211 A | * | 5/1995 | Chan ............... | H01B 7/2806 156/51 |
| 2009/0261939 A1 | * | 10/2009 | Shudarek ........... | H01F 3/10 336/212 |
| 2010/0126752 A1 | * | 5/2010 | Watanabe .......... | H05K 9/0098 174/102 D |
| 2013/0118799 A1 | * | 5/2013 | Watanabe .......... | B60R 16/0215 174/72 A |

FOREIGN PATENT DOCUMENTS

| | | | |
|---|---|---|---|
| JP | 6-176823 A | | 6/1994 |
| JP | 2002-198680 | * | 7/2002 |

* cited by examiner

*Primary Examiner* — Hung V Ngo (74) *Attorney, Agent, or Firm* — McGinn IP Law Group, PLLC.

(57) ABSTRACT

A wire harness includes first to third electric wires, a braid shield that covers the first to third electric wires, and a tube-shaped electromagnetic wave absorber having a through hole that allows the first to third electric wires to be inserted therethrough, the electromagnetic wave absorber absorbing electromagnetic waves emitted from the first to third electric wires. The braid shield covers an outer circumferential surface and two axial end surfaces of the electromagnetic wave absorber to restrict movement of the electromagnetic wave absorber in an axial direction. The braid shield satisfies 1≤n≤15 and 10≤m≤50 where the number of carriers of the braid shield is denoted by n and the number of ends of the braid shield is denoted by m.

18 Claims, 6 Drawing Sheets

WIRING MEMBER

The present application is based on Japanese patent application No. 2014-076248 filed on Apr. 2, 2014, the entire contents of which are incorporated herein by reference.

BACKGROUND OF THE INVENTION

1. Field of the Invention

The present invention relates to wiring members, particularly to a wiring member including an electromagnetic wave absorber that reduces noise emitted from an electric wire.

2. Description of the Related Art

Some wiring members for connecting devices to each other include a shield and an electromagnetic wave absorber to reduce noise emitted from electric wires (see, for example, Japanese Unexamined Patent Application Publication No. 6-176823).

A shield cable described in Japanese Unexamined Patent Application Publication No. 6-176823 includes multiple electric wires, a shield layer that covers these multiple electric wires, and a tube-shaped magnetic body. The magnetic body is made of a material such as ferrite. The magnetic body is disposed on the outer side of the shield layer to reduce noise emitted from the multiple electric wires. Japanese Unexamined Patent Application Publication No. 6-176823 also has a description that the shield layer and the magnetic body may be covered with a covering member.

SUMMARY OF THE INVENTION

In the structure of the shield cable described in Japanese Unexamined Patent Application Publication No. 6-176823, the magnetic body, if not covered with a covering member, would move in the axial direction as a result of sliding over the outer surface of the shield layer, possibly failing to fix the magnetic body at an appropriate position. If the shield layer and the magnetic body are covered with a covering member, the position of the magnetic body is fixed by the covering member, which entails an additional operation for forming the covering member.

The present invention was made in view of the above-described circumstances and aims to provide a wiring member simply structured and capable of restricting movement of an electromagnetic wave absorber in an axial direction.

In order to solve the above-described problems, an aspect of the present invention provides a wiring member that includes an electric wire, a braid shield that covers the electric wire, and a tube-shaped electromagnetic wave absorber having a through hole that allows the electric wire to be inserted therethrough. The electromagnetic wave absorber absorbs electromagnetic waves emitted from the electric wire. The braid shield covers an outer circumferential surface and two axial end surfaces of the electromagnetic wave absorber to restrict movement of the electromagnetic wave absorber in an axial direction. The braid shield satisfies $1 \leq n \leq 15$ and $10 \leq m \leq 50$ where the number of carriers of the braid shield is denoted by n and the number of ends of the braid shield is denoted by m.

A wiring member according to an aspect of the invention is simply structured and capable of restricting movement of an electromagnetic wave absorber in an axial direction.

BRIEF DESCRIPTION OF THE DRAWINGS

The foregoing and other exemplary purposes, aspects and advantages will be better understood from the following detailed description of the invention with reference to the drawings, in which.

DESCRIPTION OF THE PREFERRED EMBODIMENTS

Embodiment

Referring now to the drawings, and more particularly to FIGS. 1-6, there are shown exemplary embodiments of the methods and structures according to the present invention.

Figure 1:
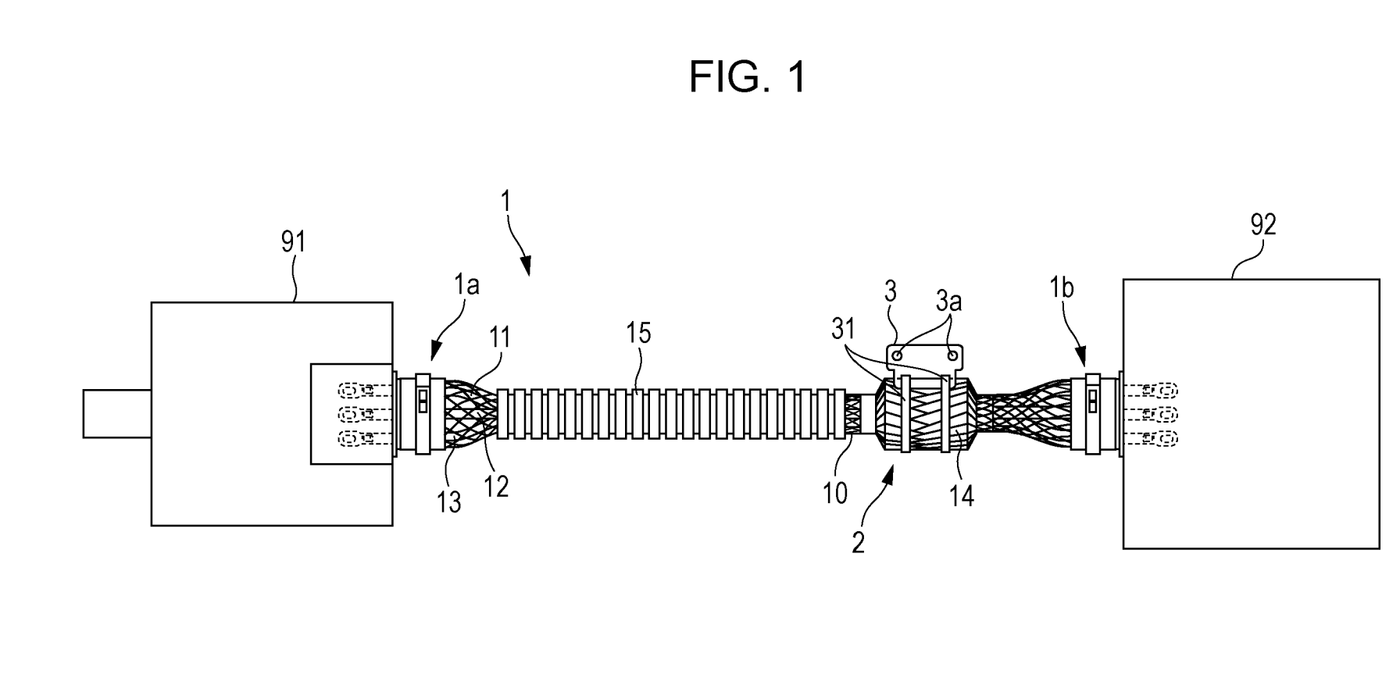
FIG. 1 is a schematic diagram of a wire harness according to an embodiment of the present invention and an electric motor and an inverter connected together with the wire harness.

FIG. 1 is a schematic diagram of a wire harness 1 according to an embodiment of the present invention and an electric motor 91 and an inverter 92 connected together by the wire harness 1. The wire harness 1 is an example of a wiring member according to an aspect of the invention.

The wire harness 1 is installed in, for example, a vehicle. The wire harness 1 is used to feed driving electric current, output from the inverter 92 after being subjected to pulse width modulation (PWM) control, to the electric motor 91, which is a driving source for generating force to drive the vehicle. The driving electric current contains harmonics caused by switching of a switching element such as a power transistor.

The wire harness 1 includes a first electric wire holding portion 1a, fixed to a casing of the electric motor 91, at one end thereof and a second electric wire holding portion 1b, fixed to a casing of the inverter 92, at the other end thereof. The wire harness 1 also includes multiple (three) electric wires (first to third electric wires 11 to 13), used to feed three-phase alternating currents including U-phase, V-phase, and W-phase currents to the electric motor 91, a braid shield 10, which covers the first to third electric wires 11 to 13, a tube-shaped electromagnetic wave absorber 2, which allows the first to third electric wires 11 to 13 to be inserted therethrough, a fixing member 3, which is used to fasten the electromagnetic wave absorber 2 to a vehicle body of the vehicle driven by the electric motor 91, a resin tape 14, wound around the electromagnetic wave absorber 2 and the braid shield 10, and a tube-shaped corrugated tube 15, serving as a container member made of a flexible insulator. Instead of the corrugated tube 15, a metal pipe is also usable as a container member.

The first to third electric wires 11 to 13 are connected to the electric motor 91 at one end thereof and to the inverter 92 at the other end thereof. More specifically, first end portions of the first to third electric wires 11 to 13 protruding from a first electric wire holding portion 1a fixed to the casing of the electric motor 91 are connected to a terminal base, not illustrated, of the electric motor 91. Second end portions of the first to third electric wires 11 to 13 protruding from a second electric wire holding portion 1b fixed to the casing of the inverter 92 are connected to a terminal base, not illustrated, of the inverter 92.

The electromagnetic wave absorber 2 is located near the second electric wire holding portion 1b. Specifically, the electromagnetic wave absorber 2 is located on the side closer to the inverter 92, which causes noise, in the longitudinal direction of the first to third electric wires 11 to 13. Thus, the electromagnetic waves emitted from the first to third electric wires 11 to 13 are efficiently absorbed by the electromagnetic wave absorber 2.

The resin tape 14 is wound around the electromagnetic wave absorber 2 and the outer circumference of a region of the braid shield 10 extending from one end portion to another end portion of the electromagnetic wave absorber 2. The braid shield 10 is squeezed toward the first to third electric wires 11 to 13 by the resin tape 14 on both sides of the electromagnetic wave absorber 2 in the axial direction of the first to third electric wires 11 to 13.

The fixing member 3 is located at an outer circumferential portion of the electromagnetic wave absorber 2 and fixed to the portion with belt-shaped fasteners 31. The fasteners 31 squeeze the electromagnetic wave absorber 2 from the outer side of the resin tape 14. The fixing member 3 has insertion holes 3a through which bolts are inserted so that the fixing member 3 can be fixed to the vehicle body.

The corrugated tube 15 covers part of the first to third electric wires 11 to 13 and the braid shield 10. In this embodiment, the corrugated tube 15 is located between the electromagnetic wave absorber 2 and the first electric wire holding portion 1a. The corrugated tube 15 has alternate portions of large-diameter portions and small-diameter portions in order to have high flexibility.

The first electric wire holding portion 1a and the second electric wire holding portion 1b have similar structures. Subsequently, the structure of the first electric wire holding portion 1a is described in detail as an example with reference to FIGS. 2A and 2B.

Figure 2A:
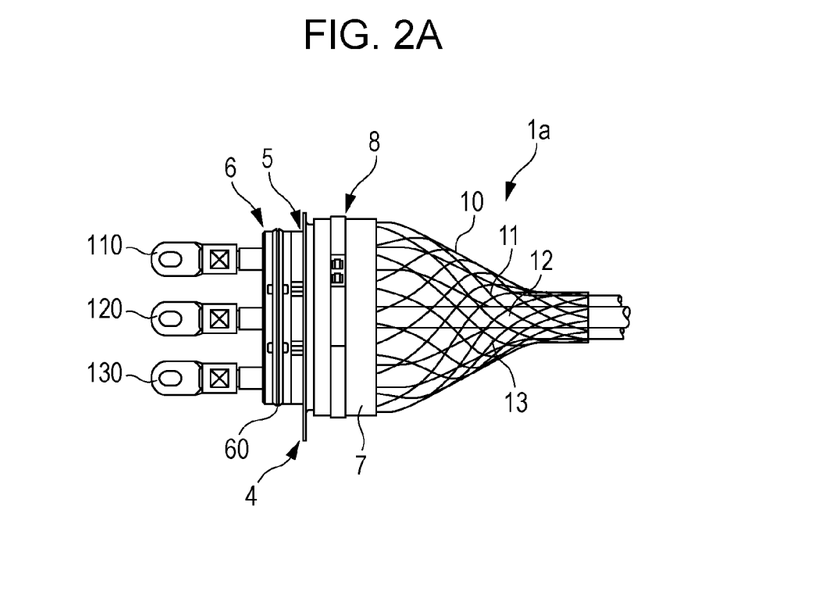
FIG. 2A is an exterior view of a first electric wire holding portion and FIG. 2B is an exploded view of the first electric wire holding portion.
Figure 2B:
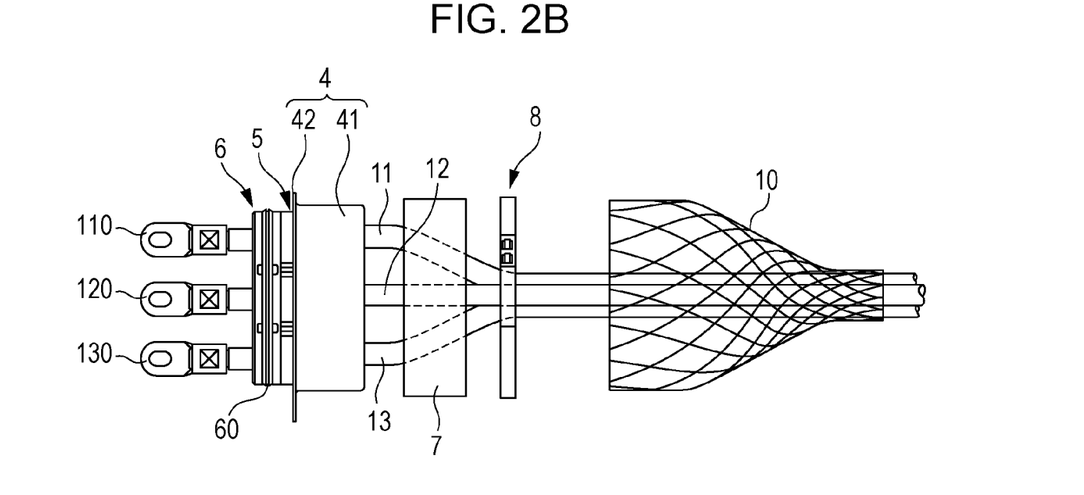

FIG. 2A is an exterior view of the first electric wire holding portion 1a and FIG. 2B is an exploded view of the first electric wire holding portion 1a.

The first electric wire holding portion 1a includes a shield shell 4, which is made of a conductive metal, a resin-made housing 5, which holds the first to third electric wires 11 to 13 and part of which is accommodated in the shield shell 4, a seal holding member 6, which is connected to the housing 5 and holds an annular seal member 60, a ring-shaped member 7, disposed on the outer circumference of the braid shield 10, and a belt-shaped fastening member 8. Connection terminals 110, 120, and 130 are connected to ends of the respective first to third electric wires 11 to 13 by, for example, pressure bonding.

The shield shell 4 includes a tube-shaped container portion 41, which accommodates part of the housing 5, and a flange portion 42, fixed to the casing of the electric motor 91, and these portions are integrated in a single unit. The flange portion 42 has bolt insertion holes, not illustrated, so that the shield shell 4 is fixed to a grounded casing of the electric motor 91 with bolts inserted through the bolt insertion holes.

The housing 5 has insertion holes that allow the first to third electric wires 11 to 13 to be inserted therethrough and is fixed to the container portion 41 of the shield shell 4 by, for example, press fitting. The seal member 60 held by the seal holding member 6 seals the seal holding member 6 off from the inner surface of an attachment hole formed in the casing of the electric motor 91.

The ring-shaped member 7 is, for example, an acetate cloth tape. The ring-shaped member 7 is annularly wound around the outer circumference of the braid shield 10 several times in the state where the braid shield 10 is interposed between the ring-shaped member 7 and the container portion 41 of the shield shell 4. The fastening member 8 is made of, for example, metal such as stainless steel, and disposed around the outer circumference of the ring-shaped member 7. The braid shield 10 is pressed against the shield shell 4 by the fastening force of the fastening member 8. Thus, the braid shield 10 is electrically connected to the casing of the electric motor 91 with the shield shell 4 interposed therebetween.

Figure 3:
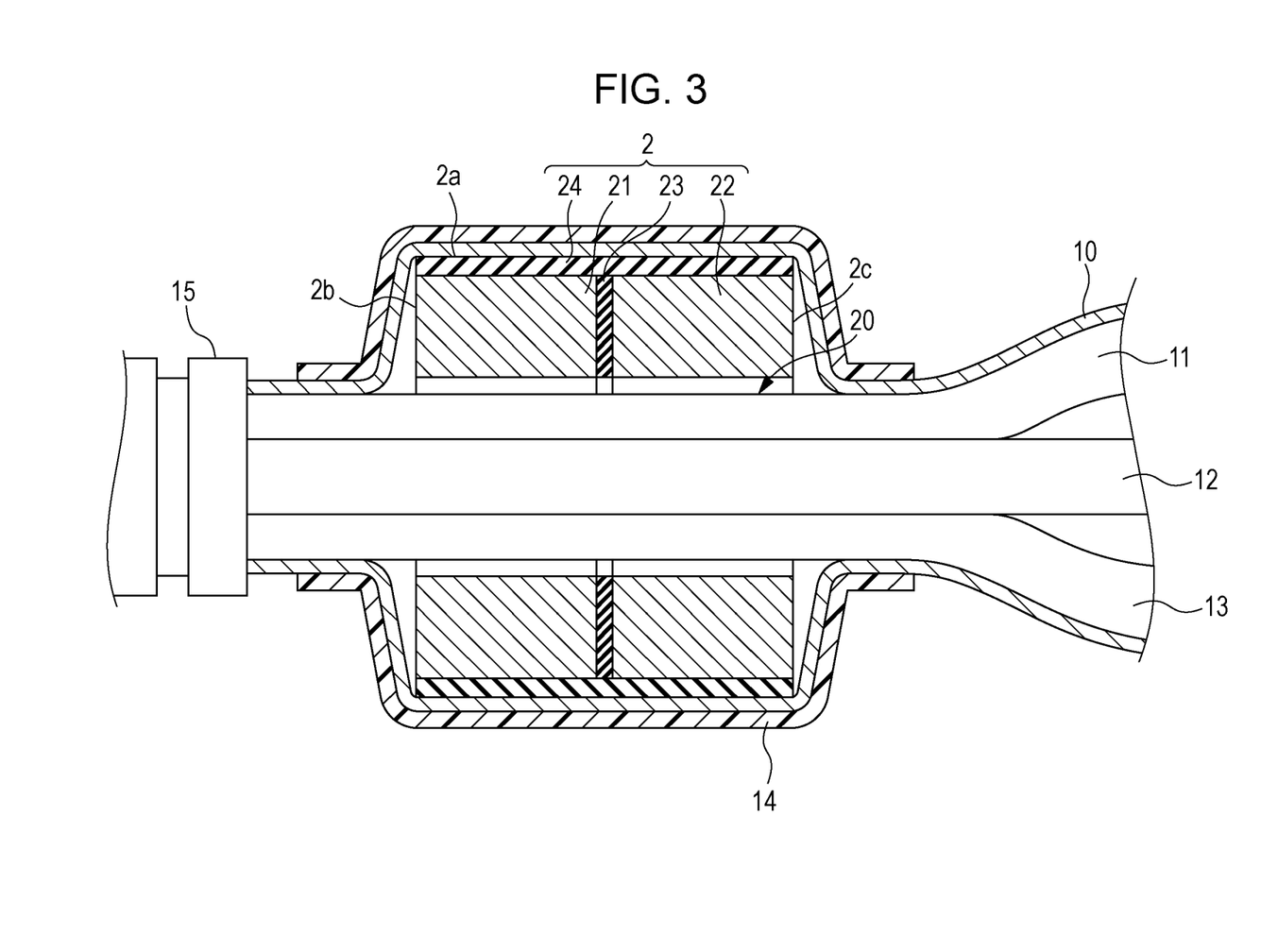
FIG. 3 is a cross-sectional view of the wire harness at a portion around the electromagnetic wave absorber.
Figure 4:
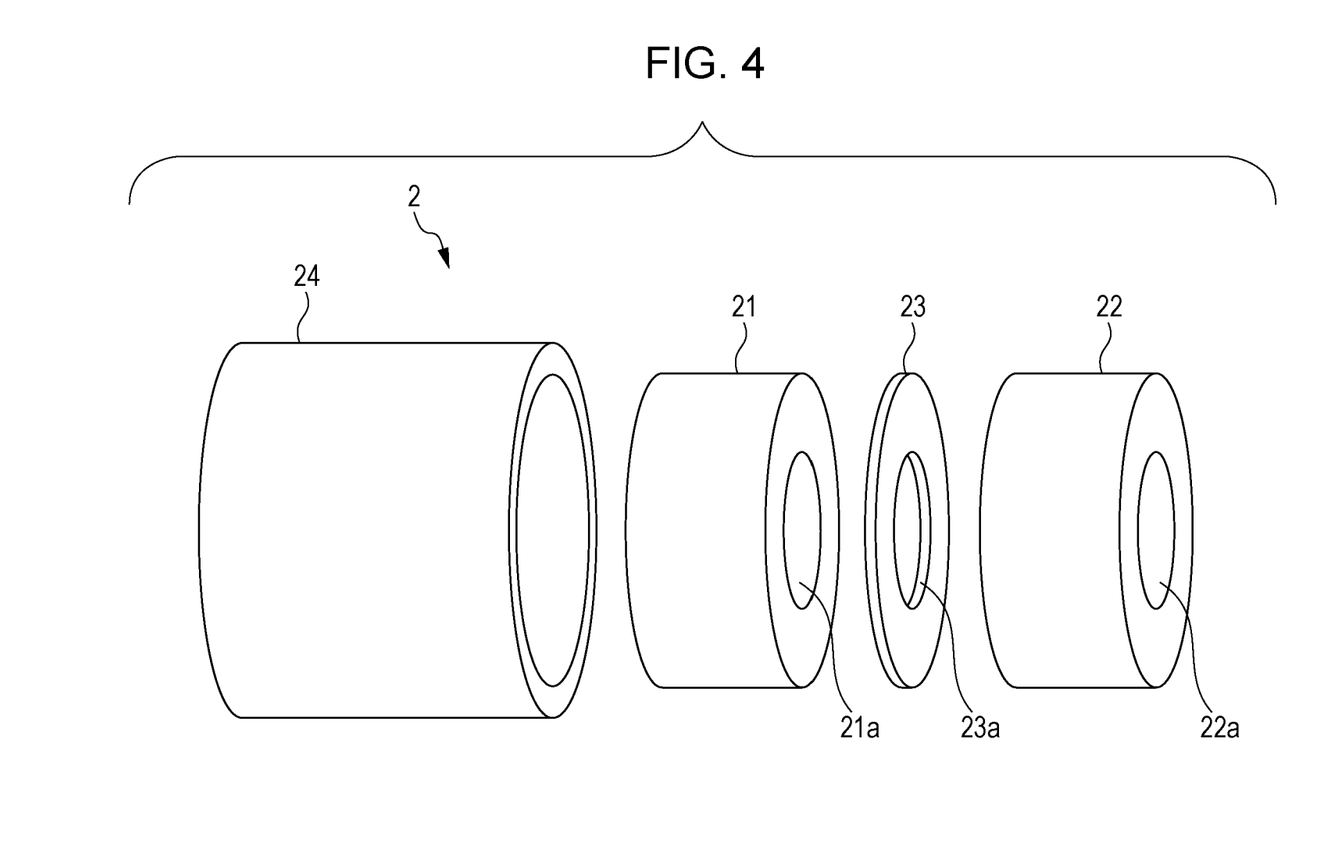
FIG. 4 is an exploded perspective view of the electromagnetic wave absorber.

FIG. 3 is a cross-sectional view of the wire harness 1 at a portion around the electromagnetic wave absorber 2. Specifically, FIG. 3 shows a cross section of the electromagnetic wave absorber 2, the resin tape 14, and the braid shield 10 taken along the first to third electric wires 11 to 13. FIG. 4 is an exploded perspective view of the electromagnetic wave absorber 2.

A through hole 20 that allows the first to third electric wires 11 to 13 to be inserted therethrough is formed in a center portion of the electromagnetic wave absorber 2. Specifically, multiple electric wires (first to third electric wires 11 to 13) are collectively inserted into the through hole 20 of the electromagnetic wave absorber 2. The first to third electric wires 11 to 13 have the same outer diameter, which falls within a range of 10% to 46% of the inner diameter of the through hole 20.

The electromagnetic wave absorber 2 includes a first magnetic core 21, a second magnetic core 22, a first rubber member 23, and a second rubber member 24. The through hole 20 of the electromagnetic wave absorber 2 results from a combination of a through hole 21a formed in a center portion of the first magnetic core 21, a through hole 22a formed in a center portion of the second magnetic core 22, and a through hole 23a formed in a center portion of the first rubber member 23.

Examples usable as the first magnetic core 21 and the second magnetic core 22 include annular core members having high magnetic permeability such as a ferrite core, an amorphous core, and a Permalloy core. In this embodiment, the first magnetic core 21 and the second magnetic core 22 are made of soft ferrite (for example, manganese-zinc ferrite, nickel-zinc ferrite, or copper-zinc ferrite) that exhibits soft magnetism. Besides, hexagonal ferrite (hard ferrite), garnet ferrite, or cobalt ferrite is also usable.

The first magnetic core 21 and the second magnetic core 22 are arranged side by side in the axial direction of the first to third electric wires 11 to 13. The first magnetic core 21 may be formed as a single annular unit or formed into an annular member by combining a pair of members having a semicircular cross section. The second magnetic core 22 may be formed similarly.

The first magnetic core 21 and the second magnetic core 22 absorb electromagnetic waves (electromagnetic noise) emitted from the first to third electric wires 11 to 13 and convert the energy of the electromagnetic waves into dynamic energy such as vibrations or thermal energy. This absorption hinders the electromagnetic waves emitted from the wire harness 1 from adversely affecting peripheral control devices or other devices.

The first rubber member 23 is a disk-shaped member tightly held between the first magnetic core 21 and the second magnetic core 22 and prevents wear caused by vibrations of the vehicle or vibrations resulting from the first magnetic core 21 and the second magnetic core 22 absorbing electromagnetic waves. The second rubber member 24 is a tube-shaped member disposed on the outer circumference of the first magnetic core 21 and the second magnetic core 22 with its inner circumferential surface facing the outer circumferential surfaces of the first magnetic core 21 and the second magnetic core 22. The first rubber member 23 and the second rubber member 24 are integrated with the first magnetic core 21 and the second magnetic core 22 by, for example, bonding. The outer diameter of the electromagnetic wave absorber 2 is, for example, 58 mm. An example usable as the electromagnetic wave absorber 2 is an absorber that weighs within a range of 50 g to 600 g.

Method for Manufacturing Wire Harness 1

Figure 5A:
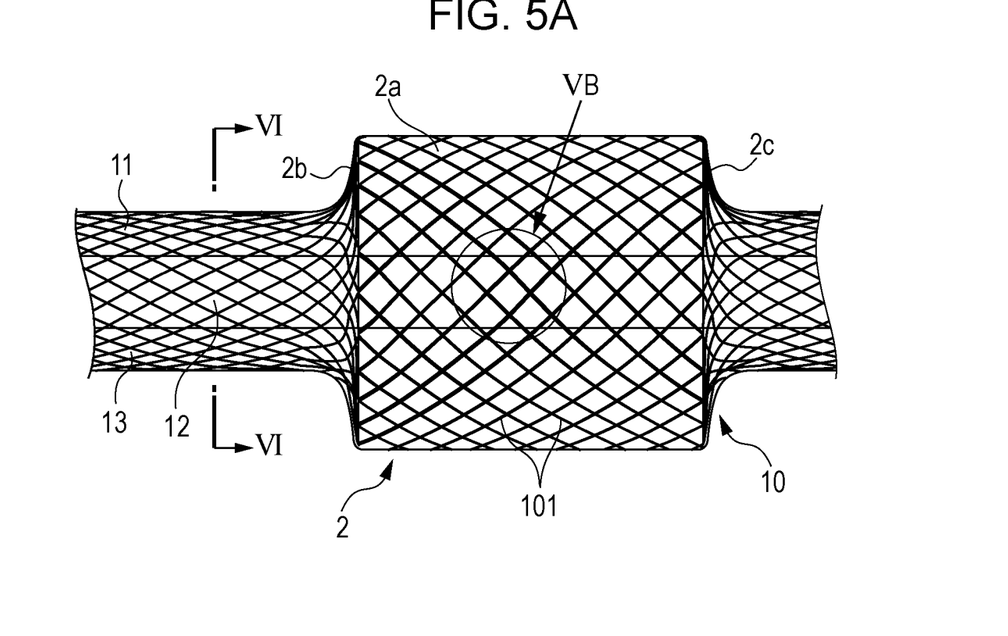
FIG. 5A is a side view of the electromagnetic wave absorber and a braid shield during manufacture before being covered with a resin tape and FIG. 5B is an enlarged view of a portion VB in FIG. 5A.
Figure 5B:
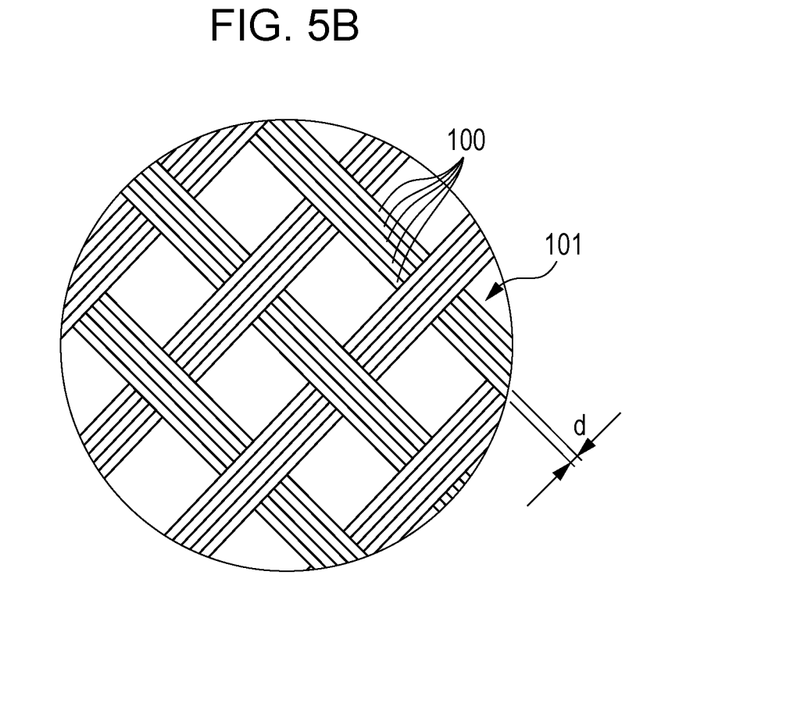
Figure 6:
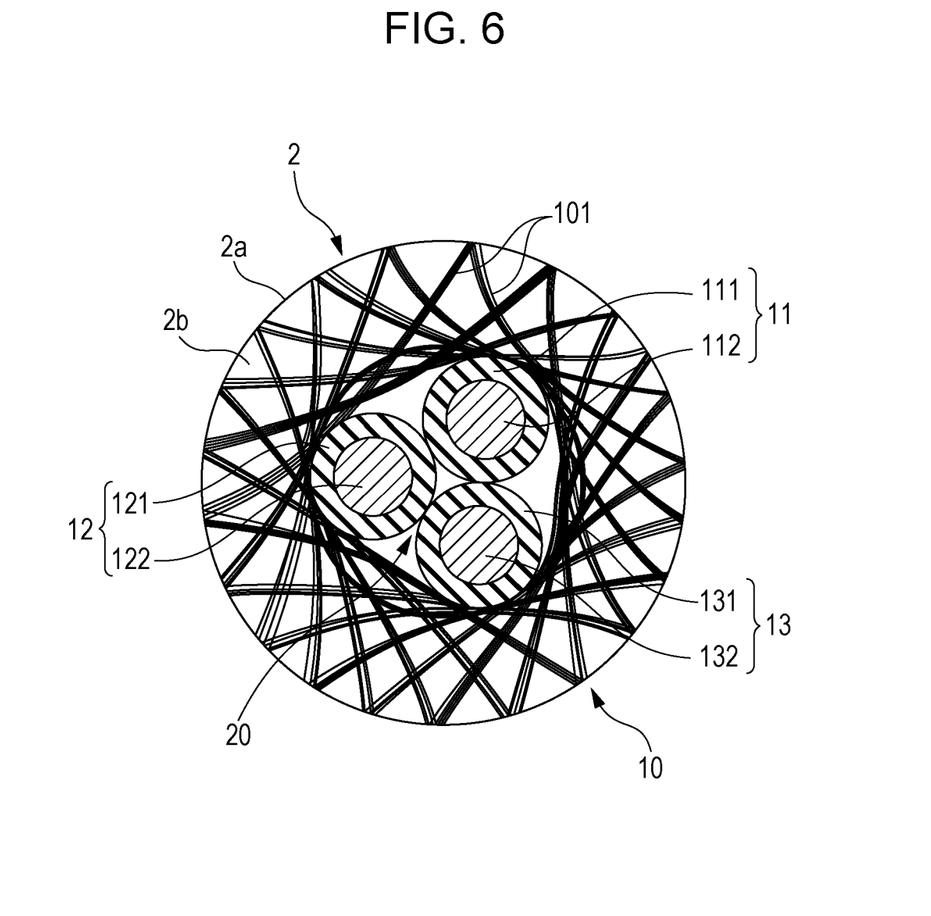
FIG. 6 is a cross sectional view of the electromagnetic wave absorber illustrated in FIG. 5A taken along the line VI-VI.

FIG. 5A is a side view of the electromagnetic wave absorber 2 and a braid shield 10 during manufacture before being covered with a resin tape 14 and FIG. 5B is an enlarged view of a portion VB in FIG. 5A. FIG. 6 is a cross sectional view of the electromagnetic wave absorber 2 illustrated in FIG. 5A taken along the line VI-VI. In FIG. 5A, the first electric wire holding portion 1a is disposed on the left of the first to third electric wires 11 to 13 and the second electric wire holding portion 1b is disposed on the right of the first to third electric wires 11 to 13.

The wire harness 1 is assembled in the following procedure during manufacture. Firstly, an insulating electric wire obtained by covering a central conductor with an insulator is cut into pieces having a predetermined length to form first to third electric wires 11 to 13. These first to third electric wires 11 to 13 are collectively inserted into the braid shield 10. At this time, the inner diameter of the braid shield 10 is larger than the thickness of the bundle of the first to third electric wires 11 to 13 and smaller than the outer diameter of the electromagnetic wave absorber 2.

Subsequently, the circumference of a portion of the braid shield 10 having a predetermined length from one end (end near the second electric wire holding portion 1b in this embodiment) in the longitudinal direction of the braid shield 10 is expanded so as to have an inner diameter larger than the outer diameter of the electromagnetic wave absorber 2. Then, the electromagnetic wave absorber 2 is placed inside the expanded portion of the braid shield 10. Thereafter, the portion of the braid shield 10 into which the electromagnetic wave absorber 2 is inserted is pressed against the first to third electric wires 11 to 13 so as to reduce its diameter and to be in a state as illustrated in FIG. 5A.

In this state, the outer circumferential surface 2a and both axial end surfaces 2b and 2c of the electromagnetic wave absorber 2 are covered with the braid shield 10 so as to restrict the movement of the electromagnetic wave absorber 2 relative to the first to third electric wires 11 to 13 in the axial direction. In other words, the braid shield 10 covers the outer circumferential surface 2a and both axial end surfaces 2b and 2c of the electromagnetic wave absorber 2 to restrict the movement of the electromagnetic wave absorber 2 in the axial direction.

Subsequently, the corrugated tube 15 is fitted on the braid shield 10 and the shield shell 4, the housing 5, and the seal holding member 6 are fitted on each of the first and second end portions of the first to third electric wires 11 to 13. Thereafter, insulators 111, 121, and 131 (see FIG. 6) at both end portions of the first to third electric wires 11 to 13 are removed so that the central conductors 112, 122, and 132 are exposed. The connection terminals 110, 120, and 130 are press-fitted to the exposed central conductors 112, 122, and 132. Thereafter, each end portion of the braid shield 10 is fixed to the outer circumference of the shield shell 4 using the ring-shaped member 7 and the fastening member 8. Thus, the first electric wire holding portion 1a and the second electric wire holding portion 1b are complete.

Thereafter, the resin tape 14 is wound around the outer circumference of a region of the braid shield 10 covering the electromagnetic wave absorber 2 and the fixing member 3 is fixed to the outer side of the resin tape 14 using the fastener 31. This completes assembly of the wire harness 1.

Structure of Braid Shield 10

As illustrated in FIGS. 5A and 5B, the braid shield 10 is formed by braiding strand braids 101, each consisting of multiple strands 100, into a lattice pattern. In this embodiment, the number of carriers of the braid shield 10 is five and the number of ends of the braid shield 10 is 36. Here, the number of carriers represents the number of strands 100 included in one strand braid 101 and the number of ends represents the number of strand braids 101 included in the braid shield 10. The strand braids 101 are wound at a pitch of, for example, 100 mm to 400 mm.

Each strand 100 is a plated copper wire, specifically, a tinned annealed copper wire. Instead, a nickel-plated or silver-plated copper wire may be used as the strand 100.

Preferably, the strand diameter d (mm) of each strand 100 falls within a range of $0.12 \leq d \leq 0.32$ (greater than or equal to 0.12 mm and fewer than or equal to 0.32 mm). When the strand 100 has a strand diameter d below 0.12 mm, the strand 100 has low strand strength and may break during manufacture of the braid shield 10 (during braiding). On the other hand, when the strand 100 has a strand diameter d over 0.32 mm, the braid shield 10 is stiff (the braid shield 10 less easily expands in the radial direction), whereby the workability of inserting the first to third electric wires 11 to 13 or the electromagnetic wave absorber 2 into the braid shield 10 may decrease.

When the number of carriers of the braid shield 10 is denoted by n and the number of ends of the braid shield 10 is denoted by m, desirably, the braid shield 10 satisfies $1 \leq n \leq 15$ and $10 \leq m \leq 50$. If the number m of ends is below 10, gaps between the strand braids 101 are so large that the braid shield 10 may fail to hold the electromagnetic wave absorber 2. If the number n of carriers exceeds 15 or the number m of ends exceeds 50, the costs of the braid shield 10 increase. Moreover, the braid shield 10 is stiff (the braid shield 10 less easily expands in the radial direction), whereby the workability of inserting the first to third electric wires 11 to 13 or the electromagnetic wave absorber 2 into the braid shield 10 may decrease.

Specifically, use of a braid shield 10 in which the number n of carriers falls within a range of 1 to 15 and the number m of ends falls within a range of 10 to 50 enables more effective restriction on the movement of the electromagnetic wave absorber 2 in the axial direction in the state where the outer circumferential surface 2a and both axial end surfaces 2b and 2c of the electromagnetic wave absorber 2 are covered with the braid shield 10 while the workability during manufacture is kept in good condition.

Operations and Effects of Embodiment

The above-described first embodiment brings about the following operations and effects.

(1) The braid shield 10 covers the outer circumferential surface 2a and both axial end surfaces 2b and 2c of the electromagnetic wave absorber 2 to restrict the movement of the electromagnetic wave absorber 2 in the axial direction. Thus, the movement of the electromagnetic wave absorber 2 in the axial direction relative to the first to third electric wires 11 to 13 can be restricted without using a special fixing member for fixing the axial position of the electromagnetic wave absorber 2. Particularly, during manufacture of the wire harness 1, assembly of the first electric wire holding portion 1a and the second electric wire holding portion 1b is required after inserting the first to third electric wires 11 to 13 into the through hole 20 of the electromagnetic wave absorber 2. Thus, if the movement of the electromagnetic wave absorber 2 in the axial direction is not restricted, the electromagnetic wave absorber 2 would hinder assembly of the first electric wire holding portion 1a and the second electric wire holding portion 1b. The embodiment, on the other hand, prevents the electromagnetic wave absorber 2 from acting as an impediment to assembly of the first electric wire holding portion 1a and the second electric wire holding portion 1b. In the case of a wire harness 1 used in a vehicle, the wire harness 1 can restrict the movement of the electromagnetic wave absorber 2 in the axial direction due to vibrations of the first to third electric wires 11 to 13 resulting from vibrations of the vehicle.

(2) In the braid shield 10, the number of carriers falls within the range of 1 to 15, the number of ends falls within the range of 10 to 50, and the strand diameter of each strand 100 falls within the range of 0.12 mm to 0.32 mm, whereby the movement of the electromagnetic wave absorber 2 in the axial direction can be more effectively restricted.

(3) The braid shield 10 is squeezed toward the first to third electric wires 11 to 13 by the resin tape 14 at both ends of the electromagnetic wave absorber 2. Thus, the movement of the electromagnetic wave absorber 2 relative to the braid shield 10 can be further effectively restricted.

(4) Electromagnetic waves emitted from the first to third electric wires 11 to 13 are absorbed by the electromagnetic wave absorber 2 in addition to the braid shield 10. Thus, the wire harness 1 according to the embodiment can exhibit appropriate noise reduction effect on a large noise generated at the inverter 92, which feeds electric current to the electric motor 91 serving as a driving source of the vehicle.

(5) The fixing member 3, disposed on the outer circumference of the electromagnetic wave absorber 2, allows the electromagnetic wave absorber 2 to be easily fixed to the vehicle body. The fixing member 3 can prevent the first to third electric wires 11 to 13 from being damaged when, for example, the first to third electric wires 11 to 13 are shaken by the electromagnetic wave absorber 2 during running of the vehicle.

(6) The first to third electric wires 11 to 13 are collectively inserted into the through hole 20 of the electromagnetic wave absorber 2. Specifically, since the first to third electric wires 11 to 13 are bundled in the electromagnetic wave absorber 2, the first to third electric wires 11 to 13 become easily handleable. This structure facilitates, for example, the operation of inserting the first to third electric wires 11 to 13 into the braid shield 10 while the first to third electric wires 11 to 13 are in the state of being inserted into the through hole 20 of the electromagnetic wave absorber 2.

(7) The outer diameter of each of the first to third electric wires 11 to 13 falls within a range of 10% to 46% of the inner diameter of the through hole 20. Thus, the first to third electric wires 11 to 13 can be easily bundled in the electromagnetic wave absorber 2, whereby facilitating the inserting operation.

SUMMARY OF EMBODIMENT

Now, technical ideas understood from the above-described embodiment are described in cooperation with reference symbols or other descriptions used in the embodiments. However, the reference symbols used in the following description do not limit components in the scope of claim to the components or the like specifically described in the embodiment.

[1] A wiring member (wire harness 1) includes an electric wire (11 to 13); a braid shield (10) that covers the electric wire (11 to 13); and a tube-shaped electromagnetic wave absorber (2) having a through hole (20) that allows the electric wire (11 to 13) to be inserted therethrough, the electromagnetic wave absorber (2) absorbing electromagnetic waves emitted from the electric wire (11 to 13). The braid shield (10) covers an outer circumferential surface (2a) and both axial end surfaces (2b, 2c) of the electromagnetic wave absorber (2) to restrict movement of the electromagnetic wave absorber (2) in an axial direction, and the braid shield (10) satisfies $1 \leq n \leq 15$ and $10 \leq m \leq 50$ where the number of carriers of the braid shield (10) is denoted by n and the number of ends of the braid shield (10) is denoted by m.

[2] In the wiring member (wire harness 1) described in the paragraph [1], the braid shield (10) includes plated copper wires as strands (100) each having a strand diameter falling within a range of 0.12 mm to 0.32 mm.

[3] In the wiring member (wire harness 1) described in the paragraph [1] or [2], the braid shield (10) is squeezed toward the electric wire (11 to 13) on both sides of the electromagnetic wave absorber (2) in the axial direction.

[4] In the wiring member (wire harness 1) described in any one of the paragraphs [1] to [3], the electric wire (11 to 13) is connected to an electric motor (91), which generates force to drive a vehicle, at one end thereof and to an inverter (92), which feeds driving electric current to the electric motor (91), at the other end thereof.

[5] The wiring member (wire harness 1) described in the paragraph [4] further includes a fixing member (3) disposed at a position outside the outer circumferential surface of the electromagnetic wave absorber (2), the fixing member (3) allowing the electromagnetic wave absorber (2) to be fixed to a vehicle body of the vehicle.

[6] In the wiring member (wire harness 1) described in any one of the paragraphs [1] to [5], a plurality of the electric wires (11 to 13) are collectively inserted into the through hole (20) of the electromagnetic wave absorber (2).

[7] In the wiring member (wire harness 1) described in the paragraph [6], the plurality of electric wires (11 to 13) are three electric wires having the same outer diameter, which falls within a range of 10% to 46% of an inner diameter of the through hole (20).

An embodiment of the invention has been described thus far, but the above-described embodiment does not limit the scope of claim of the invention. It should be noted that all the combined features described in the embodiment are not necessarily indispensable to solve the problems.

The invention can be embodied by appropriately modifying the embodiment without departing from the gist of the invention. For example, the above-described embodiment has been described using a case where the wire harness 1 is consisted of three electric wires (first to third electric wires 11 to 13). However, the invention is not limited to this case and a wire harness may be consisted of one electric wire, two electric wires, or four or more electric wires.

The above-described embodiment has been described using a case where the electromagnetic wave absorber 2 includes the first magnetic core 21, the second magnetic core 22, the first rubber member 23, and the second rubber member 24. However, the electromagnetic wave absorber 2 does not have to include rubber members (first rubber member 23 and second rubber member 24). In other words, the electromagnetic wave absorber 2 may be consisted of one or more magnetic cores.

In the above-described embodiment, the braid shield 10 covers both axial end surfaces 2b and 2c of the electromagnetic wave absorber 2 without being in contact with both axial end surfaces 2b and 2c. However, the braid shield 10 may cover both axial end surfaces 2b and 2c of the electromagnetic wave absorber 2 while being in contact with at least part of both axial end surfaces 2b and 2c.

The above-described embodiment has been described using a case where the resin tape 14 is wound around the outer side of a region of the braid shield 10 covering the outer circumference of the electromagnetic wave absorber 2. However, the present invention is not limited to this case. The wire harness 1 may dispense with the resin tape 14 if the electromagnetic wave absorber 2 can be reliably fixed without using the resin tape 14.

The above-described embodiment has been described using a case where the first to third electric wires 11 to 13 are collectively inserted into the through hole 20 of the electromagnetic wave absorber 2. However, the wire harness 1 may include multiple electromagnetic wave absorbers 2 and the first to third electric wires 11 to 13 may be inserted into through holes 20 of the respective electromagnetic wave absorbers 2.

The purpose of use of the wire harness 1 is not limited to a particular purpose: for example, the wire harness 1 may be used for communications between electronic devices of various types including computers.

Although the invention has been described with respect to specific exemplary embodiments for complete and clear disclosure, the appended claims are not to be thus limited but are to be construed as embodying all modifications and alternative constructions that may occur to one skilled in the art which fairly fall within the basic teaching herein set forth.

Further, it is noted that Applicant's intent is to encompass equivalents of all claim elements, even if amended later during prosecution.

What is claimed is:

1. A wiring member, comprising:
   an electric wire;
   a braid shield that covers the electric wire;
   a tube-shaped electromagnetic wave absorber including a through hole that allows the electric wire to be inserted therethrough, the electromagnetic wave absorber absorbing electromagnetic waves emitted from the electric wire,
     wherein the braid shield covers an outer circumferential surface and two axial end surfaces of the electromagnetic wave absorber, and
     wherein the braid shield satisfies $1 \leq n \leq 15$ and $10 \leq m \leq 50$ where a number of carriers of the braid shield is denoted by n and a number of ends of the braid shield is denoted by m; and
   a fixing member disposed at a position outside the outer circumferential surface of the electromagnetic wave absorber, the fixing member allowing the electromagnetic wave absorber to be fixed to a fixed object,
   wherein the electromagnetic wave absorber includes a magnetic core,
   wherein the electromagnetic wave absorber further includes another magnetic core arranged along with the magnetic core in an axial direction of the electric wire, and
   wherein the electromagnetic wave absorber further includes a rubber member held between the magnetic core and said another magnetic core in the axial direction of the electric wire.

2. The wiring member according to claim 1, wherein the braid shield includes plated copper wires as strands each having a strand diameter falling within a range of 0.12 mm to 0.32 mm.

3. The wiring member according to claim 1, wherein the braid shield is squeezed toward the electric wire on two sides of the electromagnetic wave absorber in the axial direction.

4. The wiring member according to claim 1, wherein the electric wire is connected to an electric motor, which generates force to drive a vehicle, at one end thereof and to an inverter, which feeds driving electric current to the electric motor, at an other end thereof.

5. The wiring member according to claim 4, wherein the fixed object includes a vehicle body of the vehicle.

6. The wiring member according to claim 1, wherein a plurality of the electric wires are collectively inserted into the through hole of the electromagnetic wave absorber.

7. The wiring member according to claim 6, wherein the plurality of electric wires include three electric wires having a same outer diameter, which falls within a range of 10% to 46% of an inner diameter of the through hole.

8. The wiring member according to claim 1, further comprising a resin tape that is wound around the electromagnetic wave absorber and an outer circumference of a region of the braid shield extending from one end portion to another end portion of the electromagnetic wave absorber, wherein the fixing member is fixed to an outer side of the resin tape.

9. The wiring member according to claim 1, wherein the electromagnetic wave absorber further includes another rubber member disposed on outer circumferences of the magnetic core and said another magnetic core.

10. The wiring member according to claim 9, wherein said another rubber member abuts the outer circumferences of the magnetic core and said another magnetic core and further abuts an outer circumference surface of the rubber member.

11. The wiring member according to claim 9, wherein the braid shield is disposed on an outer circumference surface of said another rubber member.

12. The wiring member according to claim 11, further comprising a resin tape that is wound around an outer circumference of the braid shield.

13. The wiring member according to claim 12, wherein the fixing member is attached to an outer side of the resin tape.

14. The wiring member according to claim 13, further comprising:
    belt-shaped fasteners that fasten the fixing member on an outer circumferential portion of the electromagnetic wave absorber.

15. The wiring member according to claim 14, wherein the belt-shaped fasteners squeeze the electromagnetic wave absorber from the outer side of the resin tape.

16. The wiring member according to claim 1, further comprising:
    belt-shaped fasteners that fasten the fixing member on an outer circumferential portion of the electromagnetic wave absorber.

17. The wiring member according to claim 16, wherein the belt-shaped fasteners squeeze the electromagnetic wave absorber from the outer circumferential portion of the electromagnetic wave absorber.

18. The wiring member according to claim 1, wherein the fixing member includes insertion holes through which bolts are inserted to attach the fixing member to the fixed body.

* * * * *